(12) United States Patent
Chen et al.

(10) Patent No.: US 8,497,964 B2
(45) Date of Patent: Jul. 30, 2013

(54) TFT-LCD ARRAY SUBSTRATE

(75) Inventors: Xu Chen, Beijing (CN); Seung Moo Rim, Beijing (CN); Zhenyu Xie, Beijing (CN); Xiang Liu, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 552 days.

(21) Appl. No.: 12/703,315

(22) Filed: Feb. 10, 2010

(65) Prior Publication Data

US 2010/0214518 A1  Aug. 26, 2010

(30) Foreign Application Priority Data

Feb. 23, 2009  (CN) .......................... 2009 1 0078446

(51) Int. Cl.
*G02F 1/141*  (2006.01)
*G02F 1/1343*  (2006.01)

(52) U.S. Cl.
USPC .............................. 349/139; 349/37; 349/145

(58) Field of Classification Search
USPC ................ 349/37, 139, 145–146, 42, 43, 137
See application file for complete search history.

(56) References Cited

U.S. PATENT DOCUMENTS

| 5,535,028 A * | 7/1996 | Bae et al. ....................... 349/145 |
| 2006/0044486 A1 * | 3/2006 | Noda et al. ...................... 349/43 |
| 2008/0030639 A1 | 2/2008 | Qiu et al. |
| 2008/0061295 A1 | 3/2008 | Wang et al. |

FOREIGN PATENT DOCUMENTS

| CN | 101145561 A | 3/2008 |
| JP | 2008-166765 A | 7/2008 |

\* cited by examiner

*Primary Examiner* — Jessica M Merlin
(74) *Attorney, Agent, or Firm* — Ladas & Parry LLP

(57) ABSTRACT

A thin film transistor liquid crystal display (TFT-LCD) array substrate and a method for forming the same. The thin film transistor liquid crystal display (TFT-LCD) device, comprising gate lines and data lines that intersecting with each other to define pixel regions, wherein a pixel electrode and a thin film transistor are formed in each of the pixel regions, and wherein the data lines each have a mirror-symmetry structure so that coupling capacitance between one data line and the pixel electrodes in an upper adjacent pixel region and a lower pixel region that are adjacent changes oppositely.

6 Claims, 7 Drawing Sheets

B2 - B2

C2 - C2

A3 - A3

B3 - B3

C3 - C3

A4 - A4

TFT-LCD ARRAY SUBSTRATE

BACKGROUND

The present invention relates to a thin film transistor liquid crystal display (TFT-LCD) substrate and a method for manufacturing the same.

As digital televisions become universal in recent years, conventional cathode ray tube (CRT) display devices are gradually replaced by a new generation of display devices because of its drawbacks such as non-digital configuration, large volume, heavy weight, high radiation, and the like. Typical display devices of the new generation comprise plasma display panel (PDP), organic light emitting display (OLED) and liquid crystal display (LCD), among which thin film transistor liquid crystal display (TFT-LCD) devices become more and more popular due to the merits such as lighter weight, smaller volume, lower power consumption, lower radiation, higher resolution, etc.

A TFT-LCD device comprises an array substrate and a color filter substrate facing each other with a liquid crystal layer interposed therebetween. Formed on the array substrate are gate lines, data lines, thin film transistors and pixel electrodes. The thin film transistors and the pixel electrodes can be arranged in matrix. Control signals applied to the gate lines allow for transmission of signal voltage from the data lines to the pixel electrodes, adjusting orientation of liquid crystal molecules to display a desired image. As known, the TFT-LCD device has a very complex manufacture process. If a TFT-LCD device does not meet the design specification, display quality thereof would be obviously affected. For example, coupling capacitance $C_{pd}$ between a data line and a pixel electrode has a great impact on display quality. Although the value of the coupling capacitance $C_{pd}$ is constant between adjacent pixels in design, there may be some deviation in actual production. Specifically, because data lines and pixel electrodes are formed in separate patterning processes with different masks, position deviations are likely to happen to the data lines and the pixel electrodes, causing the coupling capacitance $C_{pd}$ to vary in some regions. If all pixel electrodes in one pixel column deviate from the designed position toward a side, coupling capacitance $C_{pd}$ in each pixel region in the pixel column becomes smaller or larger, leading to darker or brighter display. In this case, the image is displayed non-uniformly in brightness, resulting in black or white belt-like mura.

SUMMARY

An embodiment of the invention provides an array substrate for a thin film transistor liquid crystal display (TFT-LCD) device, comprising gate lines and data lines that intersecting with each other to define pixel regions, wherein a pixel electrode and a thin film transistor are formed in each of the pixel regions, and wherein the data lines each have a minor-symmetry structure so that coupling capacitance between one data line and the pixel electrodes in an upper adjacent pixel region and a lower pixel region that are adjacent changes oppositely.

Another embodiment of the invention provides a method for forming a thin film transistor liquid crystal display (TFT-LCD) array substrate comprising: step 1 of depositing a gate metal film on a substrate and patterning the gate metal film to form gate lines and gate electrodes; step 2 of sequentially depositing a gate insulating layer, a semiconductor layer, a doped semiconductor layer and a source/drain metal film on the substrate after the step 1 and then performing a patterning process to form an active layer, a data stripe, a drain electrode, a source electrode and a TFT channel region; step 3 of depositing a passivation layer on the substrate after the step 2 and forming a first through-hole, a second through-hole and a third through-hole in the passivation layer by a patterning process, the first through-hole exposing the drain electrode, the second and third through-holes exposing two ends of the data stripe, respectively; and step 4 of depositing a transparent conductive layer on the substrate formed by the step 3 and then performing a patterning process to form a pixel electrode and a connecting stripe, the pixel electrode being connected through the first through-hole to the drain electrode, and the connecting stripe being connected through the second and third through-holes to the data stripes to form a data line so that the data line for one pixel column has a mirror-symmetry structure.

Further another embodiment of the invention provides a method for forming a thin film transistor liquid crystal display (TFT-LCD) array substrate comprising: step 41 of depositing a gate metal film on a substrate and patterning the gate metal film to form gate lines and gate electrodes; step 42 of sequentially depositing a gate insulating layer, a semiconductor layer, a doped semiconductor layer and a source/drain metal film on the substrate after the step 41 and then performing a patterning process to form an active layer, a data line, a drain electrode, a source electrode and a thin film transistor (TFT) channel region, the data line having a mirror-symmetry structure and intersecting with one gate line to define a pixel region, and as for an upper pixel region and a lower pixel region that are adjacent in one pixel column, the data line being disposed at one side of the upper pixel region and at the other side of the lower pixel region; step 43 of depositing a passivation layer on the substrate after the step 42 and forming a first through-hole in the passivation layer exposing the drain electrode by a patterning process; and step 44 of depositing a transparent conductive layer on the substrate formed by the step 43 and then performing a patterning process to form a pixel electrode, the pixel electrode being connected through the first through-hole to the drain electrode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Embodiments of the invention now will be described fully hereinafter with reference to the accompanying drawings.

Figure 1:
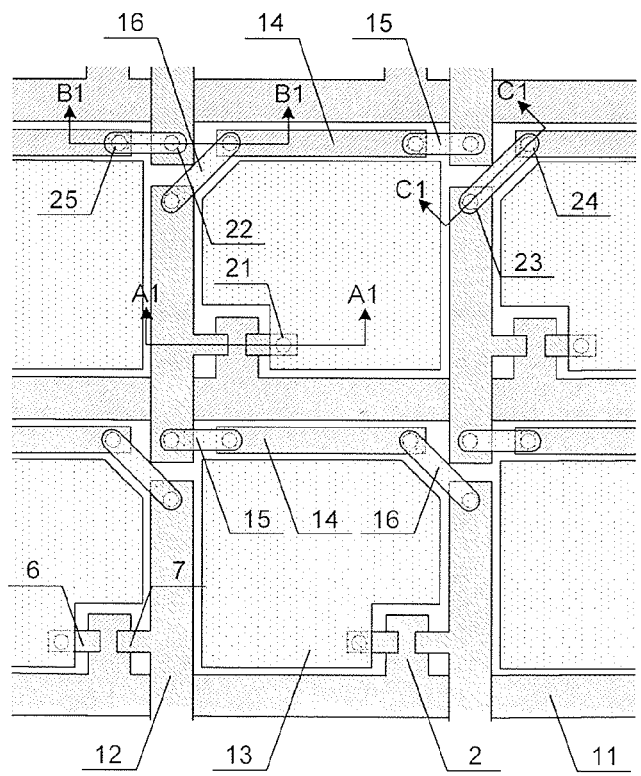
FIG. 1 is a schematic plan view showing an array substrate for a TFT-LCD device according to a first embodiment of the present invention.
Figure 2:
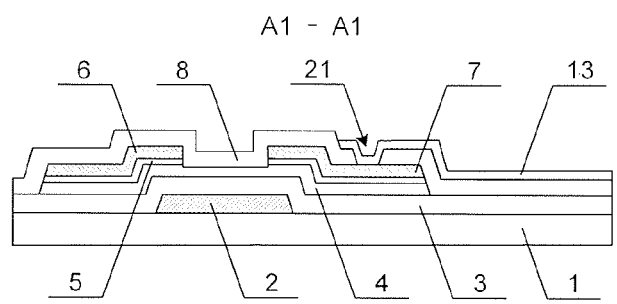
FIG. 2 is a sectional view taken along line A1-A1 in FIG. 1.
Figure 3:
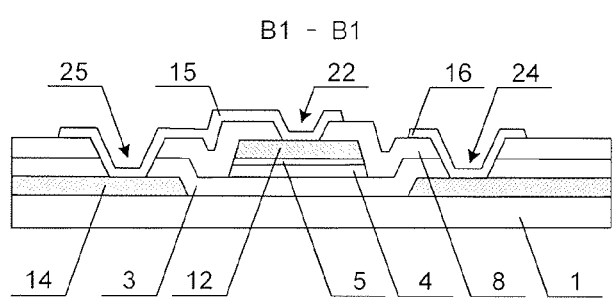
FIG. 3 is a sectional view taken along line B1-B1 in FIG. 1.
Figure 4:
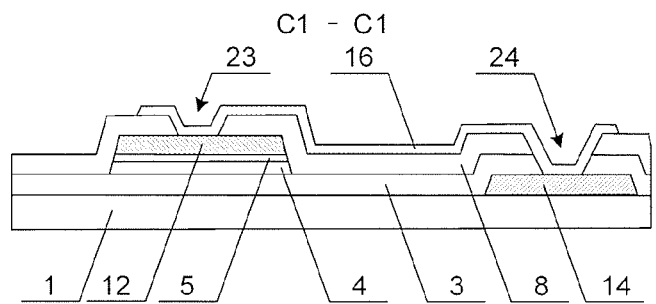
FIG. 4 is a sectional view taken along line C1-C1 in FIG. 1.

FIG. 1 is a schematic plan view showing an array substrate for a TFT-LCD device according to a first embodiment of the present invention; FIG. 2 is a sectional view taken along line A1-A1 in FIG. 1; FIG. 3 is a sectional view taken along line B1-B1 in FIG. 1; and FIG. 4 is a sectional view taken along line C1-C1 in FIG. 1.

As shown in FIGS. 1-4, the TFT-LCD array substrate of the present embodiment comprises gate lines, data lines, pixel electrodes and thin film transistors formed on a base substrate. One gate line and one data line intersect with each other to define a pixel region. The gate lines supply ON signals to the thin film transistors, the data lines supply data signals to the pixel electrodes, and the thin film transistors and the pixel electrodes are arranged in matrix, forming a plurality of pixel rows and columns. Each of the plurality of pixel rows is provided with a horizontal gate line, and each of the plurality of pixel columns is provided with a data line having a mirror-symmetry structure. The data line with a mirror-symmetry structure may cause coupling capacitances of the upper and lower adjacent pixel regions change oppositely so that non-uniform display can be eliminated in the displayed image, preventing black and white belt-like mura from occurring and improving the image quality.

Specifically, the pixel region of the present embodiment represents a sub-pixel where a gate line 11, a data stripe 12, a pixel electrode 13, a thin film transistor, and first, second and third sub connecting stripes 14, 15 and 16 are formed. The first, second and third sub connecting stripes 14, 15 and 16 are connected to the data stripe 12 so as to form a data line with a mirror-symmetry structure. The term "mirror-symmetry structure" in the present embodiment means that: as to an upper and a lower pixel regions that are adjacent in one pixel column, a data stripe 12 located on the left side of the upper pixel region is connected with a data stripe 12 located on the right side of the lower pixel region through a first sub connecting stripe 14, a second sub connecting stripe 15 and a third sub connecting stripe 16, or a data stripe 12 located on the right side of the upper pixel region is connected with a data stripe 12 located on the left side of the lower pixel region through a first sub connecting stripe 14, a second sub connecting stripe 15 and a third sub connecting stripe 16, so that a data line supplying data signal to pixel electrodes 13 in one pixel column has a mirror-symmetry structure (S-shaped structure). Thus, for one pixel row, thin film transistors are located constantly, i.e., at the left or right side of the pixel region. For two adjacent pixel rows, however, thin film transistors are located staggerly, thin film transistors in one pixel row being located at one side (e.g., the left side) of the corresponding pixel regions and thin film transistors in the other pixel row being located at the other side (e.g., the right side) of the corresponding pixel regions.

The thin film transistor of the present embodiment may comprise a gate electrode 2, a gate insulating layer 3, a semiconductor layer 4, a doped semiconductor layer (also referred to an ohmic contact layer) 5, a source electrode 6, a drain electrode 7 and a passivation layer 8. The gate electrode 2 is formed on a base substrate 1 and connected with (e.g., integrated with) the gate line 11. The first sub connecting stripe 14 may be at the same level as the gate electrode 2 and the gate line 11. The gate insulating layer 3 is formed on the gate electrode 2 and the gate line 11, covering the entire substrate 1. An active layer (the semiconductor layer 4 and the doped semiconductor layer 5) is formed on the gate insulating layer 3 and positioned over the gate electrode 2. The source electrode 6 and the drain electrode 7 is formed on the active layer. One end of the source electrode 6 is positioned over the gate electrode 2 and the other end thereof is connected with the data stripe 12. One end of the drain electrode 7 is positioned over the gate electrode 2 and the other end thereof is connected to the pixel electrode 13 through a first through-hole 21 formed in the passivation layer 8. Formed between the source electrode 6 and the drain electrode 7 is a channel region of the thin film transistor, and the doped semiconductor layer 5 in the TFT channel region is removed and even a part of the semiconductor layer 4 may be removed so that the semiconductor layer 4 can be exposed in the TFT channel region. The passivation layer 8 is formed on the data stripe 12, the source electrode 6 and the drain electrode 7, covering the entire substrate 1. The passivation layer 8 is formed with the first through-hole 21 in position corresponding to the drain electrode 7, a second through-hole 22 in position corresponding to a lower end of the data stripe 12, a third through-hole 23 in position corresponding to an upper end of the data stripe 12, a fourth through-hole 24 in position corresponding to a left end of the first sub connecting stripe 14, and a fifth through-hole 25 in position corresponding to a right end of the first sub connecting stripe 14. The pixel electrode 13, the second sub connecting stripe 15 and the third sub connecting stripe 16 are formed on the passivation layer 8. The pixel electrode 13 is connected to the drain electrode 7 through the first through-hole 21, the second sub connecting stripe 15 is connected to the lower end of the data stripe 12 through the second through-hole 22 and to the left or right end of the first sub connecting stripe 14 through the fourth or fifth through-hole 24 or 25, and the third sub connecting stripe 16 is connected to the upper end of the data stripe 12 through the third through-hole 23 and to the right or left end of the first sub connecting stripe 14 through the fifth or fourth through-hole 25 or 24, so that the data line for one pixel column has the mirror-symmetry structure. That is, the date line supplying data signal to pixel electrodes in one pixel column has the mirror-symmetry structure.

In manufacturing of a TFT-LCD substrate, position deviation is likely to happen between the data lines and the pixel electrodes because the data lines and pixel electrodes are formed in separate patterning processes with different masks. In the present embodiment, however, since one data stripe located on the left side of an upper pixel region and another data stripe located on the right side of a lower pixel region belong to one same data line so that the data line has a mirror-symmetry structure, coupling capacitances $C_{pd}$ of the upper and lower adjacent pixel regions change oppositely when position deviation occurs to the data line and the pixel electrodes, thereby eliminating non-uniform display as a whole. For example, if pixel electrodes in one pixel column all deviate toward the left side, for two upper and lower adjacent pixel regions in said one pixel column, a distance between the pixel electrode in the upper pixel region and the data line located on the left side of the upper pixel region becomes smaller, resulting in a larger coupling capacitance $C_{pd}$ for the pixel region and thus brighter display, while a distance between the pixel electrode in the lower pixel region and the data line located on the right side of the lower pixel region becomes larger, resulting in a smaller coupling capacitance $C_{pd}$ for the pixel region and this darker display. As can be seen, brightness variations of the upper and lower pixel regions tend to offset each other since coupling capacitances of the upper and lower adjacent pixel regions change oppositely, thereby eliminating non-uniform display as a whole, preventing black and white belt-like mura from occurring effectively and improving the image quality.

FIGS. 5-16 are schematic views showing a manufacture process for a TFT-LCD array substrate according to a first embodiment of the present invention. In the following description, the patterning process mentioned herein comprises photoresist coating, masking, exposure and development of photoresist, etching with formed photoresist pattern and photoresist removing processes. Hereinafter, positive photoresist is taken as an example of the photoresist.

Figure 5:
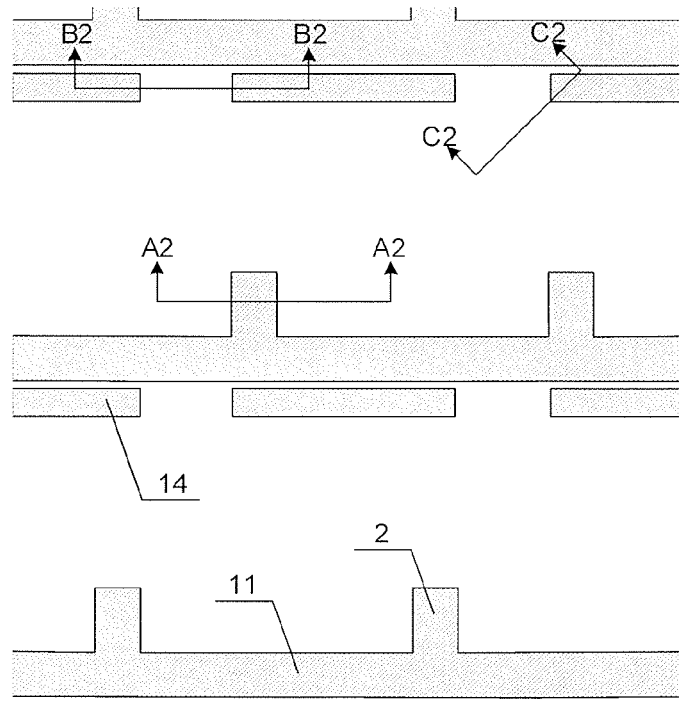
FIG. 5 is a schematic plan view showing the TFT-LCD array substrate subjected to a first patterning process according to the first embodiment of the present invention.
Figure 6:
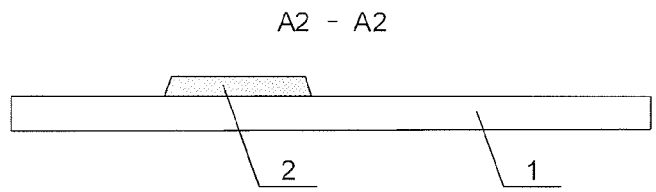
FIG. 6 is a sectional view taken along line A2-A2 in FIG. 5.
Figure 7:
FIG. 7 is a sectional view taken along line B2-B2 in FIG. 5.
Figure 8:
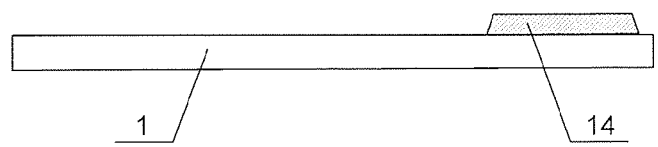
FIG. 8 is a sectional view taken along line C2-C2 in FIG. 5.

FIG. 5 is a schematic plan view of the TFT-LCD array substrate subjected to a first patterning process according to the first embodiment of the present invention, showing the structure of adjacent pixel regions; FIG. 6 is a sectional view taken along line A2-A2 in FIG. 5; FIG. 7 is a sectional view taken along line B2-B2 in FIG. 5; and FIG. 8 is a sectional view taken along line C2-C2 in FIG. 5.

First, a gate metal film is deposited on a base substrate 1 (for example a glass substrate or a quartz substrate) by a magnetron sputtering process or a thermal evaporation process. The gate metal film may be formed of a single layer of metals such as AlNd, Al, Cu, Mo, MoW and Cr, or a composite layer comprising two or more of the above metal layers. Then, referring to FIGS. 5-8, the gate metal film is patterned using a normal mask to form a pattern comprising gate electrodes 2, gate lines 11 and first sub connecting stripes 14 on the base substrate 1. As shown, the gate electrodes 2 in the upper and lower adjacent pixel regions are staggerly positioned. The first sub connecting stripe 14 extends in a horizontal direction in each pixel region and is positioned at upper edge of each pixel region (i.e., closer to a preceding gate line). As for the upper and lower adjacent pixel regions, if the gate electrode 2 in the upper pixel region is located at a side of the pixel region (e.g., the left side), the gate electrode 2 in the lower pixel region is located at an opposite side of the pixel region (e.g., the right side), forming a stagger arrangement of the gate electrode in the upper and lower adjacent pixel regions (in two adjacent pixel rows, respectively). In practice, the first patterning process of the present embodiment may also form a common electrode line pattern for a storage-capacitor-on-common-electrode-line (Cs on Common) structure.

Figure 9:
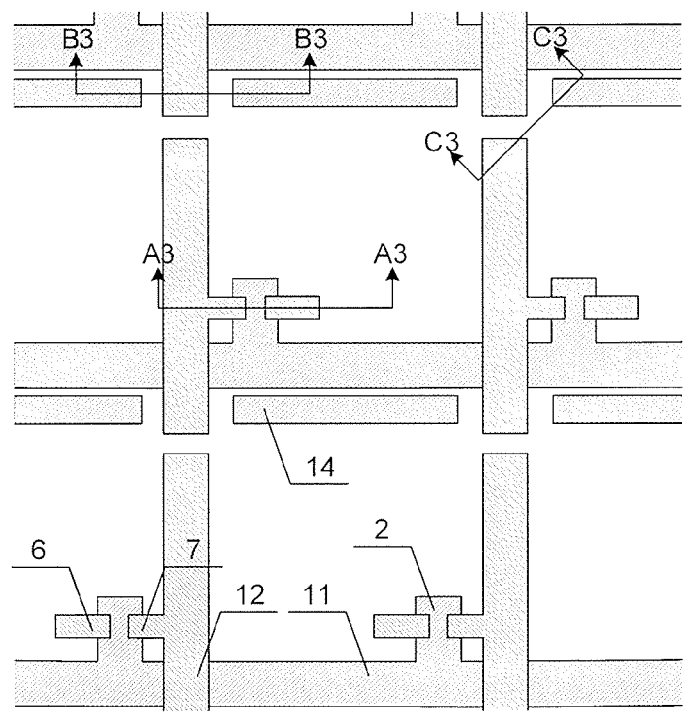
FIG. 9 is a schematic plan view showing the TFT-LCD array substrate subjected to a second patterning process according to the first embodiment of the present invention.
Figure 10:
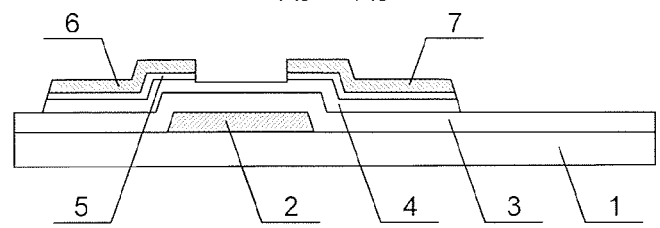
FIG. 10 is a sectional view taken along line A3-A3 in FIG. 9.
Figure 11:
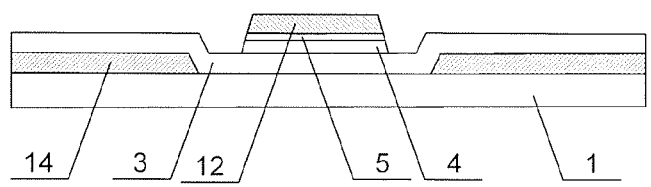
FIG. 11 is a sectional view taken along line B3-B3 in FIG. 9.
Figure 12:
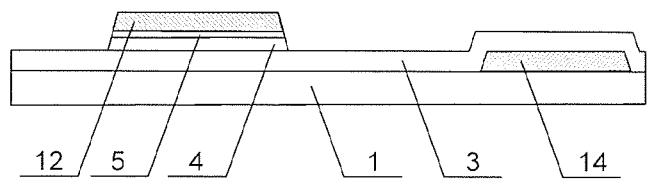
FIG. 12 is a sectional view taken along line C3-C3 in FIG. 9.

FIG. 9 is a schematic plan view of the TFT-LCD array substrate subjected to a second patterning process according to the first embodiment of the present invention, showing the structure of adjacent pixel regions; FIG. 10 is a sectional view taken along line A3-A3 in FIG. 9; FIG. 11 is a sectional view taken along line B3-B3 in FIG. 9; and FIG. 12 is a sectional view taken along line C3-C3 in FIG. 9.

On the base substrate 1 formed hereto, a plasma enhanced chemical vapor deposition (PECVD) process is used to deposit a gate insulating layer 3, a semiconductor film and a doped semiconductor film. Then, a magnetron sputtering or thermal evaporation process is utilized to form a source/drain metal film thereon. The gate insulating layer 3 may be made of a single layer of oxides such as $SiO_x$, nitrides such as $SiN_x$ or oxynitrides such as $SiO_xN_y$, or a composite layer of any combination of these materials. The source/drain metal film may be made of a single layer of Mo, MoW or Cr, or a composite layer of any combination of materials. A half tone mask or a gray tone mask may be used in a second patterning process so as to form an active layer, a data stripe 12, a source electrode 6, a drain electrode 7 and a channel region of the thin film transistor, as shown in FIGS. 9-12. In the upper and lower adjacent pixel regions, the source electrodes are staggerly positioned. The data stripe 12 extends in a vertical direction in each pixel region, and a break point between two adjacent data stripes 12 is disposed at an upper edge of each pixel region (that is, the beak point is located in the vicinity of the end of the first sub connecting stripe 14). For the upper and lower adjacent pixel regions, if the source electrode 6 in the upper pixel region is located on one side of the data stripe 12 (e.g., the left side), the source electrode 6 in the lower pixel region is located at the other side of the data stripe 12 (e.g., the right side), forming a stagger arrangement of the source electrodes in the upper and lower adjacent pixel regions (in two adjacent pixel rows). After the second patterning process, the thin film transistors are regularly arranged at the left or right side of respective pixel regions in each pixel row, and staggerly arranged in the adjacent pixel rows. Specifically, the thin film transistors are arranged at one side (e.g., the left side) of pixel regions in a pixel row, and at the other side (e.g., the right side) of pixel regions in another adjacent pixel row.

The second patterning process of the present embodiment is a patterning process using a plurality of etching steps. Specifically, the second patterning process comprises the steps of: coating a photoresist layer on the source/drain metal film and exposing the photoresist layer with a half tone mask or a gray tone mask to form an exposed region, a half-exposed region and an un-exposed region in the photoresist layer, the un-exposed region corresponding to an area where the data stripes, the source electrodes and the drain electrodes are to be formed, the half-exposed region corresponding to an area where the channel region between the source and drain regions of the thin film transistor is to be formed, and the exposed region corresponding to an area other than the above. After a developing process, the photoresist layer remains and does not change in thickness in the un-exposed region; the photoresist layer is completely removed in the exposed region, forming a photoresist-removed region; and the photoresist layer is thinned in the half-exposed region, forming a photoresist-part-remaining region. A first etching process may be performed to etch away the source/drain metal film, the doped semiconductor film and the semiconductor film in the exposed region, forming patterns of the active layer and the data stripe. An ashing process may be performed to remove the photoresist in the photoresist-part-remaining region, exposing the source/drain metal film in the region. Then, a second etching process may be used to remove the source/drain metal film, the doped semiconductor layer and a part of the semiconductor layer in the photoresist-part-remaining region, exposing the remaining semiconductor layer in the region and forming a pattern of the source electrode, the drain electrode and the channel region of the thin film transistor. Sequentially, the remaining photoresist layer is removed to complete the second patterning process. Thus, the active layer (the semiconductor layer 4 and the doped semiconductor layer 5) is formed on the gate insulating film 3 over the gate electrode 2, and the source electrode 6 and the drain electrode 7 are partly formed on the active layer. One end of the source electrode 6 is located over the gate electrode 2, and the other end thereof is connected to the data stripe 12. One end of the drain electrode 7 is located over the gate electrode 2, opposite to the source electrode 6. The doped semiconductor layer 5 and a part of the semiconductor layer 4 are etched away from the channel region between the source electrode 6 and the drain electrode 7 of the thin film transistor, exposing the remaining part of the semiconductor layer 4. The doped semiconductor layer 5 and the semiconductor layer 4 remain below the data stripe.

Figure 13:
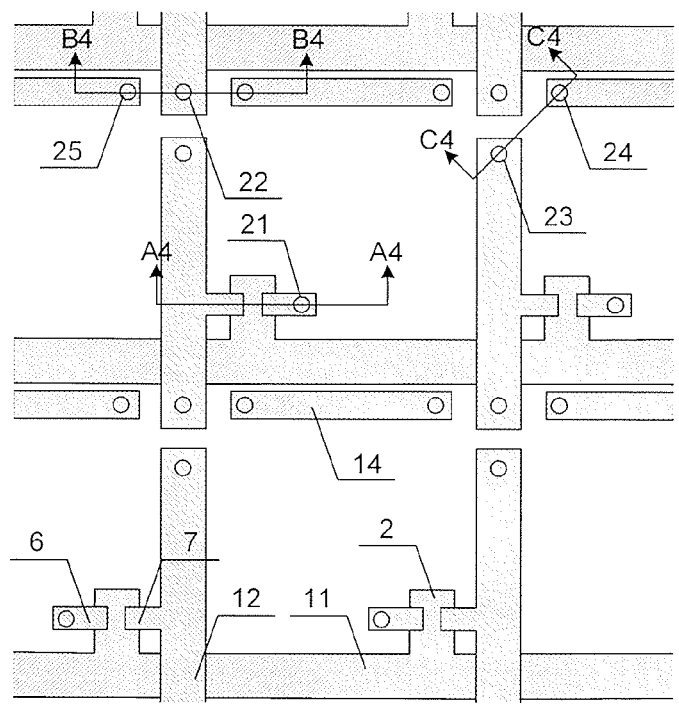
FIG. 13 is a schematic plan view showing the TFT-LCD array substrate subjected to a third patterning process according to the first embodiment of the present invention.
Figure 14:
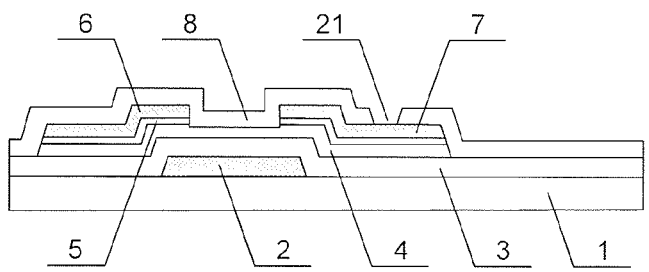
FIG. 14 is a sectional view taken along line A4-A4 in FIG. 13.
Figure 15:
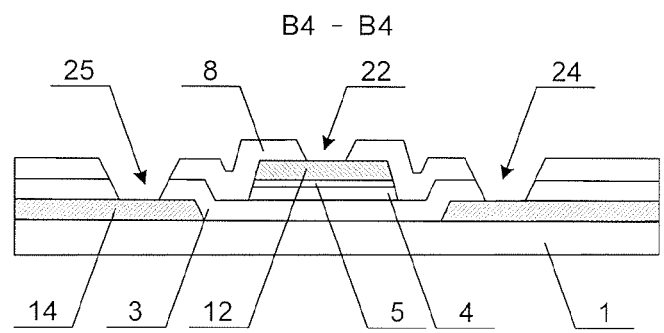
FIG. 15 is a sectional view taken along line B4-B4 in FIG. 13.
Figure 16:
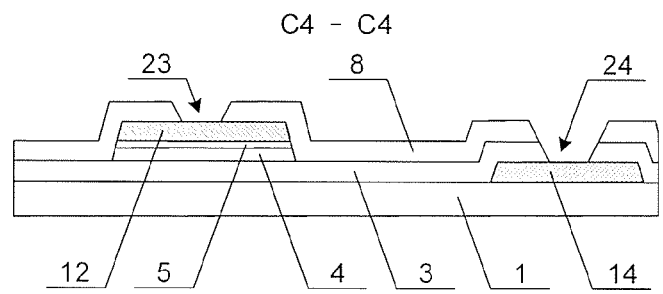
FIG. 16 is a sectional view taken along line C4-C4 in FIG. 13.

FIG. 13 is a schematic plan view of the TFT-LCD array substrate subjected to a third patterning process according to the first embodiment of the present invention, showing the structure of adjacent pixel regions; FIG. 14 is a sectional view taken along line A4-A4 in FIG. 13; FIG. 15 is a sectional view taken along line B4-B4 in FIG. 13; and FIG. 16 is a sectional view taken along line C4-C4 in FIG. 13.

On the TFT-LCD array substrate formed hereto, a passivation layer 8 may be deposited by a PECVD process. The passivation layer 8 may be formed of oxides, nitrides or oxynitrides. A normal mask may be used to pattern the passivation layer 8 so as to form a first through-hole 21, a second through-hole 22, a third through-hole 23, a fourth through-hole 24 and a fifth through-hole 25 in each pixel region, as shown in FIGS. 13-16. The first through-hole 21 is located over the drain electrode 7 and exposes a part of the drain electrode 7. The second and third through-holes 22 and 23 expose two ends of the data stripe 12, respectively; the second through-hole 22 is located at the lower end of the data stripe 12, and the third through-hole 23 is located at the upper end of the data stripe 12. The fourth and fifth through-holes 24 and 25 expose two ends of the first sub connecting stripe 14, respectively; the fourth through-hole 24 is located at the left end of the first sub connecting stripe 14, and the fifth through-hole 25 is located at the right end of the first sub connecting stripe 14. In the patterning process, a gate line contact through-hole and a data line contact through-hole are also formed to expose a gate line contact pad area and a data line contact pad area, respectively.

Then, on the TFT-LCD array substrate formed hereto, a magnetron sputtering process or a thermal evaporation process may be performed to deposit a transparent conductive film. The transparent conductive film may be of a single layer made of material such as ITO, IZO or Al—Zn-oxide, or a composite layer made of combination of any of forgoing materials and/or other metals or metal oxides. The transparent conductive film may be patterned using a normal mask so that the pixel electrode 13, the second sub connecting stripe 15 and the third sub connecting stripe 16 are formed within the each pixel region, as shown in FIGS. 1-4. In the pixel region, the pixel electrode 13 is connected to the drain electrode 7 through the first through-hole 21, the second sub connecting stripe 15 is connected to the lower end of the data stripe 12 through the second through-hole 22 and to the left or right end of the first sub connecting stripe 14 through the fourth or fifth through-hole 24 or 25, and the third sub connecting stripe 16 is connected to the upper end of the data stripe 12 through the third through-hole 23 and to the right or left end of the first sub connecting stripe 14 through the fifth or fourth through-hole 25 or 24.

Hereinafter, connections between the data stripe 12 and the first, second and third sub connecting stripes 14, 15 and 16 will be discussed in detail with relation to two upper and lower adjacent pixel regions in one pixel column.

In the upper pixel region, the right end of the second sub connecting stripe 15 is connected through the second through-hole 22 to the lower end of the data stripe 12 located on the right side of the present pixel region, and the left end thereof is connected through the fifth through-hole 25 to the right end of the first sub connecting stripe 14, so that the data stripe 12 located on the right side of the present pixel region have the lower end connected with the first sub connecting stripe 14. The left end of the third sub connecting stripe 16 is connected through the third through-hole 23 to the upper end of the data stripe 12 located on the left side of the present pixel region, and the right end thereof is connected through the fourth through-hole 24 to the left end of the first sub connecting stripe 14, so that the first sub connecting stripe 14 is connected to the data stripe 12 located on the left side of the present pixel region. As such, the lower end of the data stripe 12 located on the right side of the upper pixel region is connected to the upper end of the data stripe 12 located on the left side of the upper pixel region by the first, second and third sub connecting stripes 14, 15 and 16.

In the lower pixel region, the left end of the second sub connecting stripe 15 is connected through the second through-hole 22 to the lower end of the data stripe 12 located on the left side of the present pixel region, and the right end thereof is connected through the fourth through-hole 24 to the left end of the first sub connecting, stripe 14, so that the data stripe 12 located on the left side of the present pixel region have the lower end connected with the first sub connecting stripe 14. The right end of the third sub connecting stripe 16 is connected through the third through-hole 23 to the upper end of the data stripe 12 located on the right side of the present pixel region, and the left end thereof is connected through the fifth through-hole 25 to the right end of the first sub connecting stripe 14, so that the first sub connecting stripe 14 is connected to the upper end of the data stripe 12 located on the right side of the present pixel region. As such, the lower end of the data stripe 12 located on the left side of the lower pixel region is connected to the upper end of the data stripe 12 located on the right side of the lower pixel region by the first, second and third sub connecting stripes 14, 15 and 16.

As seen, for the two upper and lower adjacent pixel regions in one pixel column, the data stripe 12 located on the left side of the upper pixel region is connected to the data stripe 12 located on the right side of the lower pixel region by the first, second and third sub connecting stripes 14, 15 and 16, or the data stripe 12 located on the right side of the upper pixel region is connected to the data stripe 12 located on the left side of the lower pixel region by the first, second and third sub connecting stripes 14, 15 and 16, so that the data line for the pixel column has a mirror-symmetry structure (S-shaped structure).

It should be recognized that the four patterning processes for forming the TFT-LCD array substrate according to the present embodiment is given by way of example, and those skilled in the art may also implement the structure of the TFT-LCD array substrate in present embodiment with different material or material combination by more or less patterning steps. For example, the second patterning process of the present embodiment may be performed by two patterning steps using normal masks, i.e., one patterning step using a normal mask to forming the active layer pattern, and the other patterning step using another normal mask to form the pattern of the data line, the source electrode, the drain electrode and the channel region of the thin film transistor. Details of the two patterning steps are omitted here for simplicity.

In the TFT-LCD array substrate of the present embodiment, the data line has the mirror-symmetry structure. When the pixel electrodes deviate toward the left side, coupling capacitances $C_{pd}$ of the upper and lower adjacent pixel regions change oppositely due to the mirror-symmetry structure of the data line so that a non-uniform display as a whole is eliminated in a displayed image, preventing black and white belt-like mura from occurring and improving the image quality. In addition, the present embodiment improves the process flexibility when manufacturing a TFT-LCD array substrate.

Figure 17:
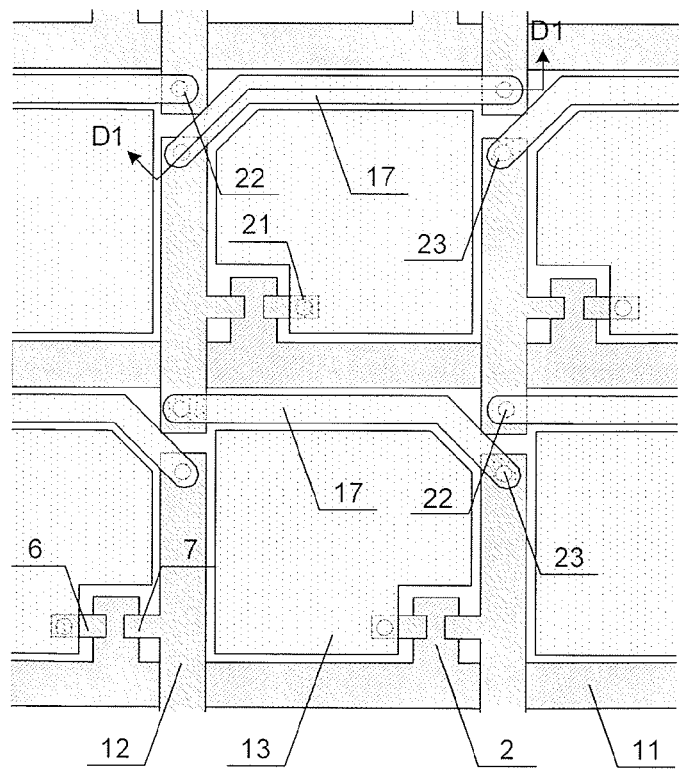
FIG. 17 is a schematic plan view showing an array substrate for a TFT-LCD device according to a second embodiment of the present invention.
Figure 18:
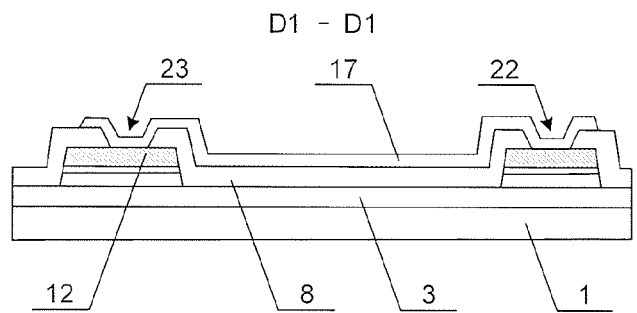
FIG. 18 is a sectional view taken along line D1-D1 in FIG. 17.

FIG. 17 is a schematic plan view of a TFT-LCD array substrate according to a second embodiment of the present invention, showing the structure of adjacent pixel regions; and FIG. 18 is a sectional view taken along line D1-D1 in FIG. 17.

The present embodiment is a variation of the first embodiment in which the first, second and third sub connecting stripes are replaced by a fourth sub connecting stripe 17. Specifically, a pixel region of the second embodiment represents a sub-pixel in which the gate line 11, the data stripe 12, the pixel electrode 13, the thin film transistor and the fourth sub connecting stripe 17 are formed. The fourth sub connecting stripe 17 is connected with the data stripe 12 so as to form a data line having the mirror-symmetry structure. The so called "mirror-symmetry structure" of the present embodiment means that: as to an upper pixel region and a lower pixel regions adjacent in one same pixel column, the data stripe 12 located on the left side of the upper pixel region is connected with the data stripe 12 located on the right side of the lower pixel region through the fourth sub connecting stripe 17, or the data stripe 12 located on the right side of the upper pixel region is connected with the data stripe 12 located on the left side of the lower pixel region through the fourth sub connecting stripe 17, so that the data line supplying data signal to pixel electrodes 13 in one same pixel column has the mirror-symmetry structure (S-shaped structure).

The gate electrode, the gate insulating film, the semiconductor layer, the doped semiconductor, the source electrode, the drain electrode and the channel region of the thin film transistor in the present embodiment are the same as those in the previous embodiment. Difference is that the passivation layer 8 is provided with a first through-hole 21 exposing a part of the drain electrode 7, a second through-hole 22 exposing the lower end of the data stripe 12, and a third through-hole 23 exposing the upper end of the data stripe 12. The pixel electrode 13 and the fourth sub connecting stripe 17 are formed on the passivation layer 18. The pixel electrode 13 is connected to the drain electrode 7 through the first through-hole 21, and the fourth sub connecting stripe 17 is connected through the second and third through-holes 22 and 23 to the data stripes 12 located at both sides of the pixel region. Specifically, in the upper pixel region, the right end of the fourth sub connecting stripe 17 is connected through the second through-hole 22 to the lower end of the data stripe 12 located on the right side of the present pixel region, and the left end thereof is connected through the third through-hole 23 to the upper end of the data stripe 12 located on the left side of the present pixel region, so that the lower end of the data stripe 12 located on the right side of the upper pixel region is connected to the upper end of the data stripe 12 located on the left side of the upper pixel region by the fourth sub connecting stripe 17; in the lower pixel region, the left end of the fourth sub connecting stripe 17 is connected through the second through-hole 22 to the lower end of the data stripe 12 located on the left side of the present pixel region, and the right end thereof is connected through the third through-hole 23 to the upper end of the data stripe 12 located on the right side of the present pixel region, so that the lower end of the data stripe 12 located on the left side of the lower pixel region is connected to the upper end of the data stripe 12 located on the right side of the lower pixel region through the fourth sub connecting stripe 17, as shown in FIGS. 17-18. In practice, the fourth sub connecting stripe 17 of the present embodiment may be disposed above the gate line so as to reduce area of the display region occupied by the fourth sub connecting stripe 17 and thus improve the aperture ratio of the display.

The process for forming the TFT-LCD array substrate according to the second embodiment is substantially the same as that in the first embodiment except that the gate electrode 2 and the gate line 11 are formed in the first patterning process, the first, second and third through-holes 21, 22 and 23 are formed in the third patterning process, and the pixel electrode 13 and the fourth sub connecting stripe 17 are formed in the last patterning process. The pixel electrode 13 is connected through the first through-hole 21 to the drain electrode 7, the fourth sub connecting stripe 17 is connected through the second and third through-holes 22 and 23 to the lower end of the data stripe 12 at one side of the pixel region and the upper end of the data stripe 12 at the other side of the pixel region, respectively, so that the data line for the pixel column has the mirror-symmetry structure.

Figure 19:
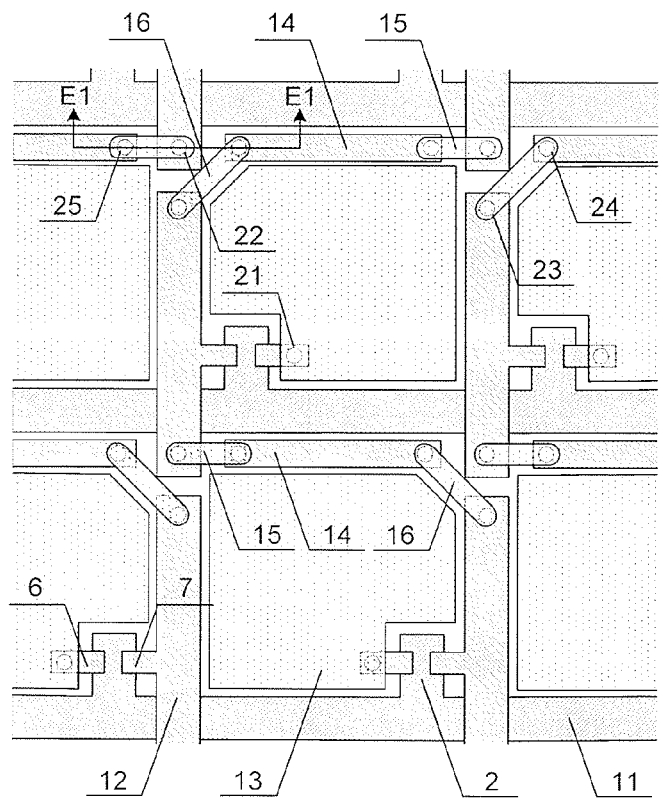
FIG. 19 is a schematic plan view showing an array substrate for a TFT-LCD device according to a third embodiment of the present invention.
Figure 20:
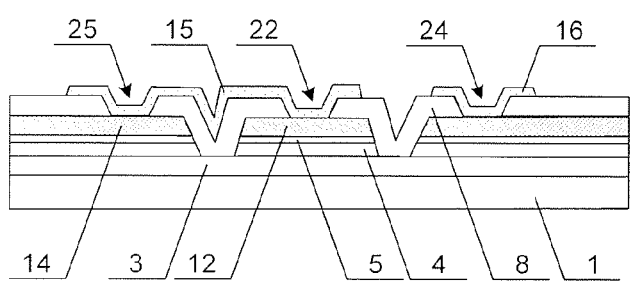
FIG. 20 is a sectional view taken along direction E1-E1 in FIG. 19.

FIG. 19 is a schematic plan view of a TFT-LCD array substrate according to a third embodiment of the present invention, showing the structure of adjacent pixel regions; and FIG. 20 is a sectional view taken along direction E1-E1 in FIG. 19.

The third embodiment is a variation of the first embodiment and is substantially the same as the first embodiment except that the first sub connecting stripe 14 is disposed at the same level as the data stripe 12. The process for forming the TFT-LCD array substrate of the present embodiment is substantially the same as that for the first embodiment except that the gate electrode 1 and the gate line 11 is formed in the first patterning process, the data stripe 12, the source electrode 6, the drain electrode 7, the TFT channel region and the first sub connecting stripe 14 is formed in the second patterning process, the first sub connecting stripe 14 extends along a horizontal direction in each pixel region and is located at the upper edge of each pixel region (i.e., below the gate line 11).

Figure 21:
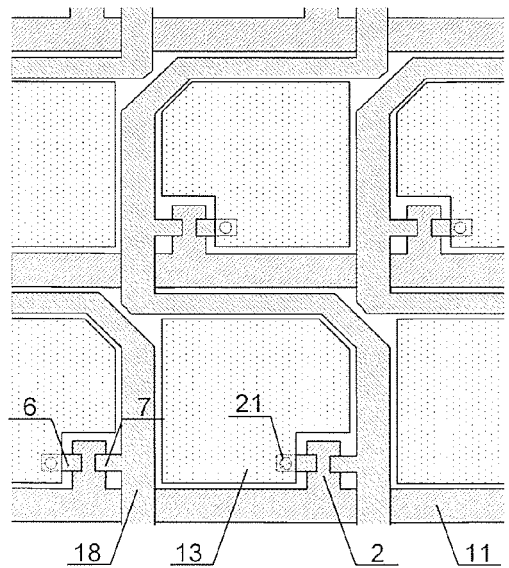
FIG. 21 is a schematic plan view showing an array substrate for a TFT-LCD device according to a fourth embodiment of the present invention.

FIG. 21 is a schematic plan view of a TFT-LCD array substrate according to a fourth embodiment of the present invention, showing the structure of adjacent pixel regions. As shown in FIG. 21, the data line 18 having a mirror-symmetry structure is integrally formed in one patterning process. Although the data line 18 has a relatively high resistance, it simplifies the manufacture process.

Figure 22:
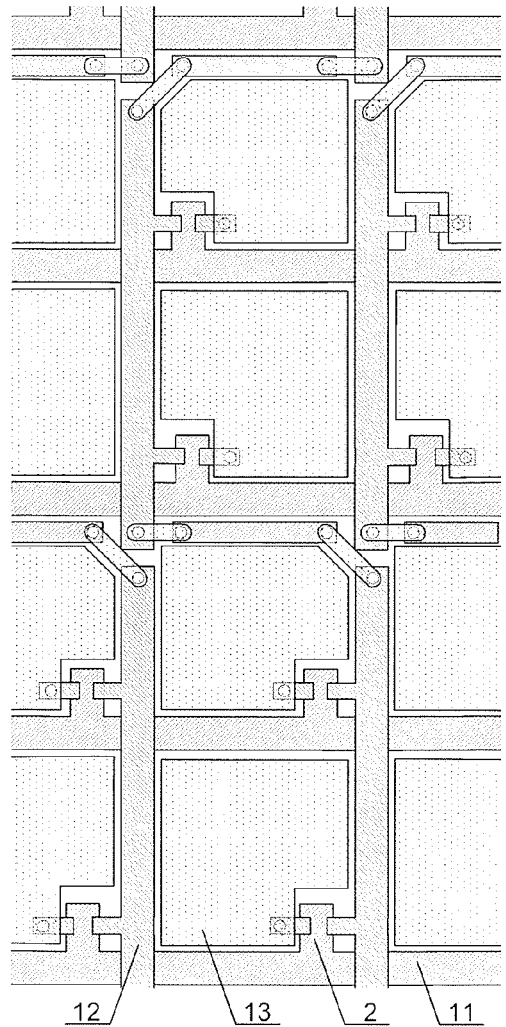
FIG. 22 is a schematic plan view showing an array substrate for a TFT-LCD device according to a fifth embodiment of the present invention.

FIG. 22 is a schematic plan view of a TFT-LCD array substrate according to a fifth embodiment of the present invention, showing the structure of adjacent pixel regions. The fifth embodiment is a variation of the first embodiment. In the present embodiment, the so-called pixel region comprises a plurality of sub-pixels, also called as a display region. Thus, the present embodiment has a mirror-symmetry structure with respect to adjacent display regions, each display region comprising a plurality of sub-pixels, while the first embodiment has the mirror-symmetry structure with respect to adjacent sub-pixels. In practice, each display region may comprise for example 2-10 sub-pixels so that a data line for one pixel column has the mirror-symmetry structure.

An embodiment of the method of manufacturing a TFT-LCD array substrate may comprise the following steps.

Step 1 of depositing a gate metal film on a substrate and patterning the gate metal film to form a gate line comprising a gate electrode.

Step 2 of sequentially depositing a gate insulating layer, a semiconductor layer, a doped semiconductor layer and a source/drain metal film sequentially on the substrate after the step 1 and then performing a patterning process to form an active layer, a data stripe, a drain electrode, a source electrode and a TFT channel region.

Step 3 of depositing a passivation layer on the substrate after the step 2 and forming a first through-hole, a second through-hole and a third through-hole in the passivation layer by a patterning process, the first through-hole exposing the drain electrode, the second and third through-holes exposing two ends of the data stripe, respectively.

Step 4 of depositing a transparent conductive layer on the substrate after the step 3 and then performing a patterning process to form a pixel electrode and a connecting stripe. The pixel electrode is connected through the first through-hole to the drain electrode, and the connecting stripe is connected through the second and third through-holes to the data stripes so that the data line for one pixel column has a mirror-symmetry structure.

In the step 2, as for upper and lower pixel regions that are adjacent in the same pixel column, the data stripe of the upper pixel region is located at one side of the upper pixel region, while the data stripe of the lower pixel region is located at the other side of the lower pixel region. The connecting stripe formed in the step 4 is characterized in that: as for two upper and lower adjacent pixel regions in the same pixel column, the data stripe located on the left side of the upper pixel region is connected to the data stripe located on the right side of the lower pixel region by the connecting stripe, or the data stripe located on the right side of the upper pixel region is connected to the data stripe located on the left side of the lower pixel region by the connecting stripe.

In the method for forming the TFT-LCD array substrate according to the embodiment, by forming the data line having the mirror-symmetry structure, coupling capacitances $C_{pd}$ of the upper and lower adjacent pixel regions change oppositely when the pixel electrodes deviate toward the left side or the right side, so that a non-uniform display as a whole is eliminated in the displayed image, preventing black and white belt-like mura from occurring and improving the image quality. In addition, the present invention improves the process flexibility when manufacturing a TFT-LCD array substrate.

Now, specific examples of the method for forming the TFT-LCD array substrate according to the embodiment will be discussed below.

A first example of the method for forming the TFT-LCD array substrate according to the embodiment may comprise the following steps.

Step 11 of depositing a gate metal film on a substrate and patterning the gate metal film to form a gate line, a gate electrode and a first sub connecting stripe.

Step 12 of sequentially depositing a gate insulating layer, a semiconductor layer, a doped semiconductor layer and a source/drain metal film on the substrate after the step 11 and then performing a patterning process to form an active layer, a data stripe, a drain electrode, a source electrode and a TFT channel region.

Step 13 of depositing a passivation layer on the substrate after the step 12 and forming a first through-hole, a second through-hole, a third through-hole, a fourth through-hole and a fifth through-hole in the passivation layer by a patterning process. The first through-hole exposes the drain electrode, the second and third through-holes exposes two ends of the data stripe, respectively. The fourth and fifth through-holes expose two ends of the first sub connecting stripe, respectively.

Step 14 of depositing a transparent conductive layer on the substrate formed by the step 13 and then performing a patterning process to form a pixel electrode, a second sub connecting stripe and a third sub connecting stripe. The pixel electrode is connected through the first through-hole to the drain electrode, the second sub connecting stripe is connected to the lower end of one data stripe through the second through-hole and to the end of the first sub connecting stripe through the fourth or fifth through-hole, and the third sub connecting stripe being connected to the upper end of another data stripe through the third through-hole and to the other end of the first sub connecting stripe through the fifth or fourth through-hole, so that the data line for one pixel column has a mirror-symmetry structure.

In the present example, the data line is formed with the mirror-symmetry structure by means of the first, second and third sub connecting stripes. The first sub connecting stripe may be disposed at the same level as the gate line, and the second and third sub connecting stripes may be disposed at the same level as the pixel electrode. The process for forming the stripes of the present example has been described with reference to FIGS. 1-16, details being omitted here for simplicity.

A second example of a method for forming the TFT-LCD according to the embodiment may comprise the following steps.

Step 21 of depositing a gate metal film on a substrate and patterning the gate metal film to form gate lines and gate electrodes.

Step 22 of sequentially depositing a gate insulating layer, a semiconductor layer, a doped semiconductor layer and a source/drain metal film on the substrate after the step 21 and then performing a patterning process to form an active layer, a data stripe, a drain electrode, a source electrode, a TFT channel region and a first sub connecting stripe.

Step 23 of depositing a passivation layer on the substrate after the step 22 and forming a first through-hole, a second through-hole, a third through-hole, a fourth through-hole and a fifth through-hole in the passivation layer by a patterning process. The first through-hole exposes the drain electrode, the second and third through-holes exposes two ends of the data stripe, respectively. The fourth and fifth through-holes exposing two ends of the first sub connecting stripe, respectively.

Step 24 of depositing a transparent conductive layer on the substrate formed by the step 23 and then performing a patterning process to form a pixel electrode, a second sub connecting stripe and a third sub connecting stripe. The pixel electrode is connected through the first through-hole to the drain electrode, the second sub connecting stripe is connected to the lower end of one data stripe through the second through-hole and to the end of the first sub connecting stripe through the fourth or fifth through-hole, and the third sub connecting stripe is connected to the upper end of another data stripe through the third through-hole and to the other end of the first sub connecting stripe through the fifth or fourth through-hole, so that the data line for one pixel column has a mirror-symmetry structure.

In the present example, the data line is formed with the mirror-symmetry structure by means of the first, second and third sub connecting stripes. The first sub connecting stripe may be disposed at the same level as the gate line, and the second and third sub connecting stripes may be disposed at the same level as the pixel electrode. The process for forming the stripes of the present embodiment has been described with reference to FIGS. 19-20, details being omitted here for simplicity.

A third example of a method for forming the TFT-LCD according to the embodiment may comprise the following example.

Step 31 of depositing a gate metal film on a substrate and patterning the gate metal film to form gate lines and gate electrodes.

Step 32 of sequentially depositing a gate insulating layer, a semiconductor layer, a doped semiconductor layer and a source/drain metal film on the substrate after the step 31 and then performing a patterning process to form an active layer, a data stripe, a drain electrode, a source electrode and a TFT channel region.

Step 33 of depositing a passivation layer on the substrate after the step 32 and forming a first through-hole, a second through-hole and a third through-hole in the passivation layer by a patterning process. The first through-hole exposes the drain electrode, and the second and third through-holes expose two ends of the data stripe, respectively.

Step 34 of depositing a transparent conductive layer on the substrate formed by the step 33 and then performing a patterning process to form a pixel electrode and a fourth sub connecting stripe. The pixel electrode is connected through the first through-hole to the drain electrode, and the fourth sub connecting stripe connects the lower end of the data stripe located at one side of the pixel region to the upper end of the data stripe located at the other side of the pixel region by the second and third through-holes, so that the data line for one pixel column has a mirror-symmetry structure.

In the present example, the data line is formed with the mirror-symmetry structure by use of the fourth sub connecting stripes. The fourth sub connecting stripe may be disposed at the same level as the pixel electrode. The process for forming the connecting stripe of the present embodiment has been described with reference to FIGS. 17-18, details being omitted here for simplicity.

In the forgoing examples of the method for forming the TFT-LCD array substrate according to the example, the mirror-symmetry structure with respect to adjacent sub-pixels may extend to a mirror-symmetry structure with respect to adjacent display regions, and each display region can comprise 2-10 sub-pixels, so that the data line for one pixel column has a mirror-symmetry structure.

A fourth example of a method for forming the TFT-LCD according to the embodiment may comprise the following steps.

Step 41 of depositing a gate metal film on a substrate and patterning the gate metal film to form gate lines and gate electrodes.

Step 42 of sequentially depositing a gate insulating layer, a semiconductor layer, a doped semiconductor layer and a source/drain metal film on the substrate after the step 41 and then performing a patterning process to form an active layer, a data line, a drain electrode, a source electrode and a TFT channel region. The data line has a mirror-symmetry structure, and as for two upper and lower adjacent pixel regions in one pixel column, the data line is disposed at one side of the upper pixel region and at the other side of the lower pixel region.

Step 43 of depositing a passivation layer on the substrate after the step 42 and forming a first through-hole in the passivation layer exposing the drain electrode by a patterning process.

Step 44 of depositing a transparent conductive layer on the substrate formed by the step 43 and then performing a patterning process to form a pixel electrode, the pixel electrode being connected through the first through-hole to the drain electrode.

In the present example, the data line having the mirror-symmetry structure is integrally formed by the patterning process, and thus the manufacture process for the TFT-LCD array substrate is simplified.

The invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. An array substrate for a thin film transistor liquid crystal display (TFT-LCD) device, comprising gate lines and data lines that intersecting with each other to define pixel regions, wherein a pixel electrode and a thin film transistor are formed in each of the pixel regions, and wherein the data lines each have an S-shaped structure so that coupling capacitance between one data line and the pixel electrodes in an upper adjacent pixel region and a lower pixel region that are adjacent changes oppositely;

wherein each data line comprises data stripes and connecting stripes connected with the data stripes, data stripes intersect with the gate lines, and as for the upper and lower adjacent pixel regions in one pixel column, the data stripe located at a left side of the upper pixel region is connected to the data stripe located at a right side of the lower pixel region by the connecting stripe, or the data stripe located at a right side of the upper pixel region is connected to the data stripe located at a left side of the lower pixel region by the connecting stripe;

wherein the connecting stripes comprises a first sub connecting stripe, a second sub connecting stripe and a third sub connecting stripe, and in one pixel region, the second sub connecting stripe serves to connect the first sub connecting stripe to a lower end of one data stripe, and the third sub connecting stripe serves to connect the first sub connecting stripe to an upper end of another data stripe, so that the data line for one pixel column has the S-shaped structure;

wherein the first sub connecting stripe within one pixel region is disposed at a same level as the data stripes and extends parallel to the gate lines, and the second and third sub connecting stripes within the same pixel region are disposed at a same level as the pixel electrodes.

2. The TFT-LCD array substrate of claim 1, wherein the upper and lower adjacent pixel regions are located in one same pixel column, and wherein the upper pixel region comprises 1-10 sub-pixels and the lower pixel region comprises 1-10 sub-pixels.

3. The TFT-LCD array substrate of claim 1, wherein as for two upper and lower adjacent pixel regions in one pixel column, the data line is disposed on a side of the pixel electrode in the upper pixel region and on an opposite side of the pixel electrode in the lower pixel region so that the data line for the pixel column has the S-shaped structure.

4. The TFT-LCD array substrate of claim 3, wherein the upper and lower adjacent pixel regions are located in one same pixel column, and wherein the upper pixel region comprises 1-10 sub-pixels and the lower pixel region comprises 1-10 sub-pixels.

5. The TFT-LCD array substrate of claim 1, wherein as for the adjacent upper and lower pixel regions, thin film transistors are disposed at one side of sub-pixels in one pixel region and at the other side of sub-pixels in the other pixel region so that the thin film transistors are staggerly provided.

6. The TFT-LCD array substrate of claim 5, wherein the upper and lower adjacent pixel regions are located in one same pixel column, and wherein the upper pixel region comprises 1-10 sub-pixels and the lower pixel region comprises 1-10 sub-pixels.

\* \* \* \* \*